United States Patent
Frutschy et al.

(10) Patent No.: US 6,853,061 B2
(45) Date of Patent: Feb. 8, 2005

(54) DUAL POWER SUPPLY METHOD AND APPARATUS

(75) Inventors: Kris Frutschy, Phoenix, AZ (US); Glenn Stewart, Mesa, AZ (US); Hong Xie, Phoenix, AZ (US); Brent Stone, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 10/273,608

(22) Filed: Oct. 18, 2002

(65) Prior Publication Data

US 2004/0075165 A1 Apr. 22, 2004

(51) Int. Cl.[7] .............................................. H01L 23/02
(52) U.S. Cl. ...................... 257/679; 257/678; 257/684; 257/693
(58) Field of Search ................................ 257/678, 679, 257/683, 684, 778, 693, 691

(56) References Cited

U.S. PATENT DOCUMENTS 5,556,811 A * 9/1996 Agatstein et al.
5,980,267 A * 11/1999 Ayers et al.
6,369,444 B1 * 4/2002 Degani et al.
2003/0198033 A1 * 10/2003 Panella et al.

* cited by examiner

*Primary Examiner*—Long Pham
*Assistant Examiner*—DiLinh Nguyen
(74) *Attorney, Agent, or Firm*—Schwabe, Williamson & Wyatt, P.C.

(57) ABSTRACT

The present invention relates to apparatus and methods for providing a low resistance power supply to a microelectronic package through the use of dual conductive paths. A first conductive path contained within the substrate and supplies current, primarily in responding to transient current demands to the microelectronic package. A lower resistance second conductive path supplies primarily steady state current to the microelectronic package through an electrical connection to an edge of the microelectronic package. Resistance in the second conductive path is reduced by using a power clamp to connect the second power supply to the microelectronic package.

13 Claims, 3 Drawing Sheets

DUAL POWER SUPPLY METHOD AND APPARATUS

FIELD OF THE INVENTION

This invention pertains to an apparatus and method to provide a low resistance power supply to microelectronic packages. In particular, the present invention pertains to supplying steady state current to microelectronic packages primarily through one conductive path and a low resistance power clamp, and providing a second conductive path to primarily accommodate the transient current demands of microelectronic packages.

BACKGROUND OF INVENTION

Higher performance, lower cost, increased miniaturization of integrated circuit components, and greater packaging density of integrated circuits are ongoing goals of the computer industry. As these goals are achieved, microelectronic dice become smaller and power demands become greater. Decreased size, increased number of circuits and greater power demands put a greater demand on state of the art electrically conductive traces within the substrate, which carry current from the power supply to the microelectronic package.

Commonly, microelectronic packages consist of a microelectronic die coupled to a carrier substrate and covered with an encapsulation material, a heat dissipating device or otherwise made into a finished package. Microelectronic packages typically interconnect with a substrate, such as a motherboard, printed circuit board or interposer, through a socket connection. The primary technique for providing current to the microelectronic package is through an electrically conductive trace contained on or within the layers of the substrate, which is otherwise known as the socket path.

Microelectronic packages require a steady state current supply to account for normal operation and current leakage. As the number of circuits increase and their size decreases, the amount of current leak increases, which in turn increases the steady state current demand. To perform certain operations, microelectronic packages require a sudden increase in current above steady state. This is known as transient current demand. Thus, the socket path must be able to carry both the steady state current and the transient current demand.

A voltage regulation device regulates the voltage for the microelectronic package by stepping down an input voltage to a usable level for various components. For example some voltage regulation modules will step from twelve volts input to approximately one and a half volts output. The voltage regulation device is typically electrically interconnected with the socket path of the substrate, which carries the necessary current to the microelectronic package.

The current supplied to the microelectronic package via the socket path and the socket connection requires about half the microelectronic package leads be devoted to current supply, which leaves the other half of the leads to act as input/output connections. For example, on a 400 lead package approximately 200 are dedicated to handling the current and 200 are dedicated to input/output connections. It is desirable to reduce the number of leads devoted to current supply, so that the number of input/output leads can be increased or the package size can be decreased.

FIG. 4 is an example of a socket path delivery assembly currently used in the art. Voltage regulation device 50 is electrically coupled to substrate 52. Microelectronic package 54 is also electrically coupled to substrate 52 via socket 56. Power is supplied to microelectronic package 54 via the socket path 58, which is a conductive material within the substrate 52, and the socket 56.

The technique of using a socket path presents a number of problems. First, the current capacity of the socket path is limited, which limits both steady state and transient demand current that can be delivered to a microelectronic package. As such, the socket path is often pushed to capacity or above capacity, which causes overheating and can result in damage to the substrate, the conductive trace of the socket path, or the components on the substrate. To increase the electrical current capacity of the socket path, more layers in the substrate and additional conductive traces are used, which increases substrate cost and complexity. Accordingly, currently used, standard, more inexpensive substrates, which have fewer layers and conductive pathways, do not have a socket path that can deliver a higher steady state current and adequately respond to the transient current demands of more advanced microelectronic packages. It is thus desirable to be able to accommodate the increase in current levels and increase the capacity of the conductive paths that carry current to the microelectronic package without adding cost and complexity to the substrate.

Another problem, as described above, is the number of package leads devoted to power and the number devoted to input/output. It is desirable to decrease the number of leads devoted to the supply of current, which in turn would allow for an increase in the number of input/output leads or a reduction in package size.

Another technique for delivering current from a voltage regulation device to the microelectronic package involves using a conductive path that is wholly outside the substrate. This external conductive path, for example a power cable, has a higher current capacity and a lower path resistance, and thereby can accommodate higher current demands by the microelectronic package. The external conductive path, however, has a significantly higher loop inductance than the socket path, which dramatically impairs the ability to respond to transient current demand and ultimately limits the performance of the microelectronic package.

Another problem exists with the external power path in regard to its electrical interconnect with the microelectronic package. This interconnect is currently made via a card edge-type connector. This type of connection has a relatively high contact resistance, which limits the current flow to the microelectronic package.

Considering the above, a method and apparatus for delivering a higher steady state current to a package via a low resistance conductive path with a low contact resistance electrical interconnect, while being able to adequately respond to the transient current demands of the microelectronic package, without increasing the cost and complexity of current substrates is desired. These and other variations as well as the invention itself will become more readily apparent upon reference to the following detailed description.

DETAILED DESCRIPTION OF THE DRAWINGS

Although the figures illustrate various views of the illustrated embodiments, these figures are not meant to portray substrates, microelectronic packages, connectors, conductive paths or voltage regulation devices in precise detail. Rather, these figures illustrate conductive paths for carrying current to a microelectronic package in a manner to more clearly convey the concepts of the illustrated embodiments. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Figure 1:
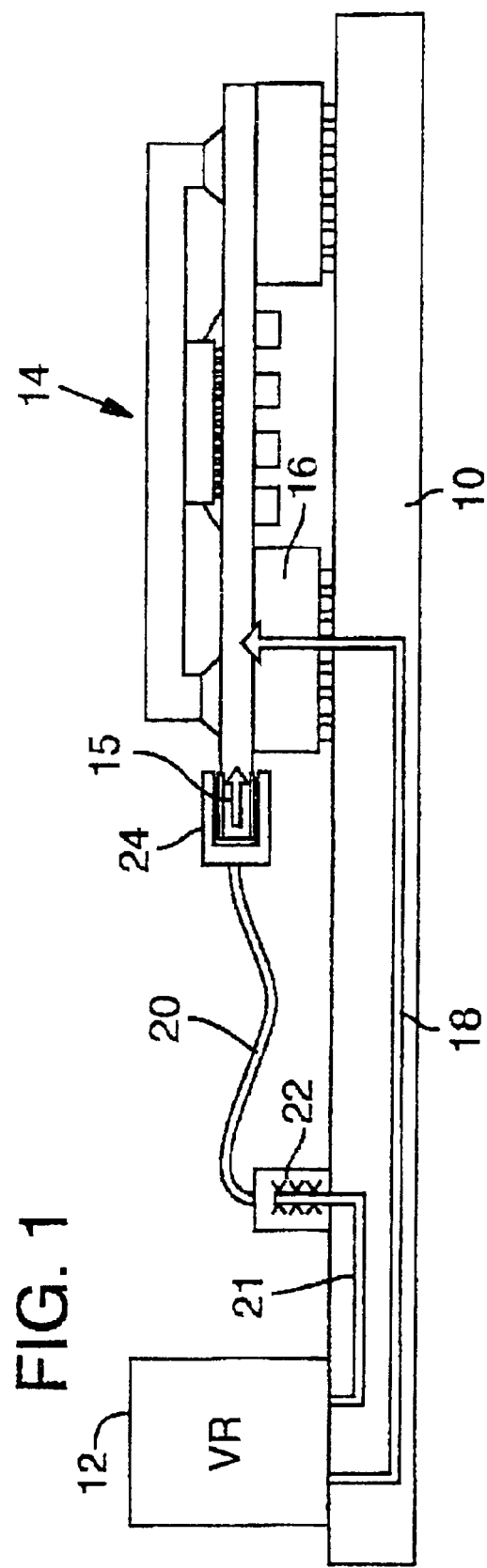
FIG. 1 is a side view of a dual conductive path delivery apparatus for a microelectronic package in accordance with an embodiment of the invention.

FIG. 1 is a side view of a current delivery apparatus in accordance with an embodiment of the present invention. Substrate 10 is in electrical communication with voltage regulation device 12 and microelectronic package 14. Substrate 10 can be, for example, a printed circuit board, interposer, motherboard or the like. Voltage regulator 12 is electrically coupled or interconnected to substrate 10. Microelectronic package 14 is also electrically interconnected with substrate 10. In the illustrated embodiment, microelectronic package 14 interconnects with substrate 10 through socket 16, which is also electrically interconnected with substrate 10. It can be appreciated by one skilled in the art that microelectronic package 14 can electrically interconnect with the substrate through a number of different socket designs or configurations, as well as microelectronic package 14 can directly interconnect with substrate 10 without socket 16.

Current is carried to microelectronic package 14 from voltage regulation device 12 through a first conductive path 18. First conductive path 18 is made up of at least one electrically conductive trace on or within substrate 10, and if a socket is used, may include one or more conductive paths through the socket. First conductive path 18 can be a variety of conductive materials, including but not limited to copper, aluminum, silver or other materials with electrically conductive properties.

The current delivery apparatus further comprises a second electrically conductive path 20 that electrically interconnects voltage regulator 12 with microelectronic package 14. Second conductive path 20 is made up of a conductive material, such as copper, aluminum, silver or any other electrically conductive material. In one embodiment, second conductive path 20 comprises a conductive cable, which includes, but is not limited to twisted pair, ribbon, flat, or coaxial cable types.

As shown, second conductive path 20 electrically interconnects with the voltage regulation device 12 through connector 22, which is secured to substrate 10. A short third conductive path 21 electrically interconnects voltage regulation device 12 with connector 22. It can be appreciated by one skilled in the art, however, that second conductive path 20 can electrically interconnect directly with voltage regulation device 12, without connector 22 or third conductive path 21.

Connector 22 can comprise electrical interconnects known in the art, such as a through hole mount or a surface mount technology. Regardless of how connector 22 is electrically interconnected with substrate 10, use of connector 22 allows second conductive path 20 to be removably connected to substrate 10, such that it could be removed and/or replaced with other conductive paths of the same or of a different type. In another embodiment, the second conductive path 20 electrically interconnects to substrate 10 without connector 22, such as by soldering, thus rendering second conductive path 20 not readily removable.

Second conductive path 20 also electrically interconnects with microelectronic package 14. In addition to first conductive path 18, second conductive path 20 provides a second path for delivering current to the microelectronic package. The electrical interconnect between second conductive path 20 and microelectronic package 14 is via a side or edge 15 of microelectronic package 14.

The first conductive path 18 and external conductive path 20 each have a predetermined electrical resistance. First conductive path 18 will have a higher resistance due to the smaller size of the conductive traces of first conductive path 18 and constraints imposed by the complexity of routing in substrate 10. Whereas, second conductive path 20 has a lower relative resistance due to its larger conductive area. Where second conductive path 20 electrically interconnects to voltage regulation device 12 via connector 22 and third conductive path 21, third conductive path 21 limits to some extent the current capacity of second conductive path 20. This limit is less than that of first conductive path 18 because third conductive path 21 is relatively short and can be located in a low density area of substrate 10 where there is not a substantial amount of routing complexity. The electrical resistance of second conductive path 20 can be lowered even more, as detailed below, if an increased force is applied at clamp 24 to edge 15 of microelectronic package 14, which reduces contact resistance.

The second conductive path 20, which has a lower resistance relative to first conductive path 18, is the primary path for steady state current supply to microelectronic package 14. Accordingly, first conductive path 18 is left with additional current capacity to handle the transient current demands of microelectronic package 14. It is understood, however, that some steady state current may still flow through first conductive path 18. For example, in one embodiment in accordance with the invention, the steady state current ratio between second conductive path 20 and first conductive path 18 is approximately 3 to 1.

Figure 2:
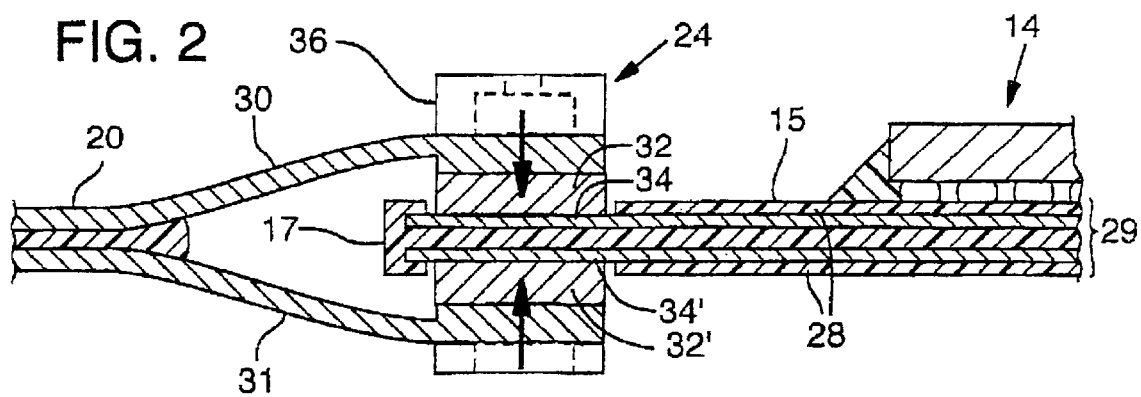
FIG. 2 is a cross-section view of the partially external power path and microelectronic package interconnect in accordance with an embodiment of the invention.

Though it has a lower resistance and thus better accommodates steady state current demand, second conductive path 20 has a considerably higher loop inductance than first conductive path 18. This increased loop inductance, which is proportional to the distance between the delivery path 30 and return path 31 (as shown in FIG. 2) of second conductive path 20, impairs the ability of external conductive path 20 to respond to the transient current demands of the microelectronic package 14. As such, first conductive path 18 is better suited than second conductive path 20 to respond to transient current demands, not only due to its lower loop inductance, but also due to the additional capacity of first conductive path 18 that otherwise would have been used by steady state current in a system having only a first conductive path 18. It can be appreciated, however, that second conductive path 20 may still accommodate some of the transient current demand, just as first conductive path 18 may accommodate some of the steady state current. Though not depicted in FIG. 1, the loop inductance of second conductive path 20 can also be reduced by using inline capacitors, which would thus increase the amount of transient current demand that would traverse second conductive path 20.

First conductive path 18 works in conjunction with second conductive path 20, which optimizes accommodation of both steady state and transient current demands by microelectronic package 14. Accordingly, use of first and second conductive paths 18 and 20 together to deliver current to the microelectronic package 14 results in an overall resistance and loop inductance that is lower than either first or second conductive path 18 or 20 alone, which in turn increases performance of the microelectronic package 14.

FIG. 2 is a cross-section view of an electrical interconnect between second conductive path 20 and microelectronic package 14. In accordance with an embodiment of the invention, conductive path 20 is electrically coupled to an edge 15 of microelectronic package 14 through power clamp 24. Power clamp 24 contains first and second conductive plates 32 and 32', which are configured to respectively contact exposed first and second conductive planes 34 and 34' of carrier substrate 29 of microelectronic package 14. Second conductive path 20, whether it be a ribbon cable, coaxial cable or some other conductive material, generally has a delivery path 30 and a return path 31. Delivery path 30 electrically couples to first conductive plate 32 and return path 31 electrically couples to second conductive plate 32'.

Though the described embodiment considers a solid plate for first and second conductive plates 32, 32', and first and second conductive planes 34, 34' for microelectronic package 14, one skilled in the art would appreciate that any number of contact configurations can be used, including pads, bars, holes and the like. Additionally, the material of first and second conductive plates 32, 32' and first and second contact planes 34, 34' comprises any conductive material, including, but not limited to copper, aluminum and silver.

As illustrated in FIG. 2, first and second conductive planes 34, 34' are exposed surfaces of carrier substrate 29. It can be appreciated by one skilled in the art, however, that first and second conductive planes 34, 34' can comprise a number of configurations, such as exposed leads or pads, planes extending from carrier substrate 29 or other configurations which allow power clamp 24 to electrically interconnect with an edge 15 of microelectronic package 14.

As discussed in the background of the invention, current external power paths electrically interconnect with a microelectronic package via a card edge type connector. It is believed that typical card edge connectors apply a force of less than 5 pounds between the contact surface of conductive plates and the conducive planes of the microelectronic package, which results in a certain amount of contact resistance. Applicant has found, however, that the greater the force between first and second conductive plates 32, 32' and first and second conductive planes 34, 34', the lower the contact resistance due to greater surface to surface contact between the conductive materials of first and second conductive plates 32, 32' and first and second conductive planes 34, 34'.

A variety of clamping mechanisms can be used to increase the force on first and second conductive plates 32, 32' resulting in an increase of the surface to surface contact with first and second conductive planes 34, 34', and thus decrease contact resistance.

Figure 3A:
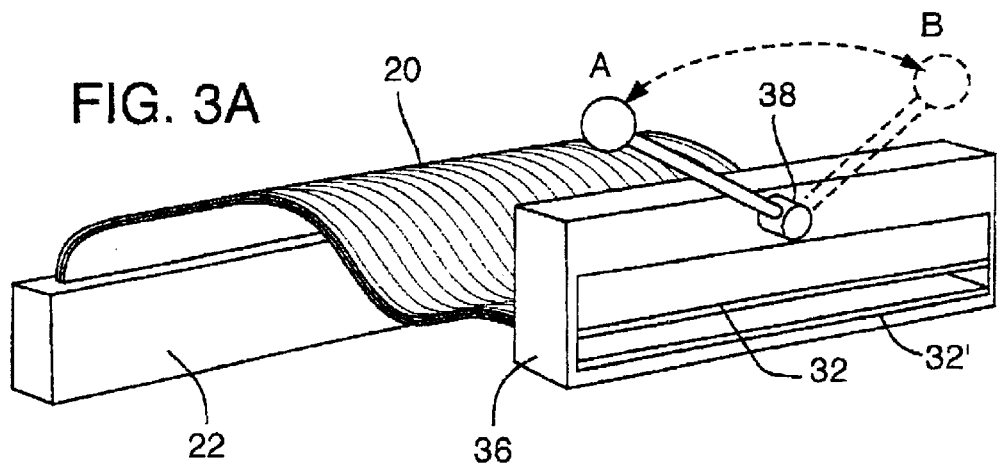
FIG. 3A is a perspective view of a power clamp utilizing a lever actuated clamping mechanism in accordance with an embodiment of the invention.

FIG. 3A is a perspective view of a clamping mechanism in accordance with an embodiment of the invention. The clamping mechanism comprises a lever 38 mechanically coupled to clamp frame 36. Housed within clamp frame 36 is a cam mechanism of conventional design. When lever 38 is moved from an unengaged position A to engaged position B, the cam mechanism causes downward force to be applied to first conductive plate 32 creating a clamping force between first and second conductive plates 32, 32'. This clamping force causes first and second conductive plates 32 and 32' to forcibly engage first and second contact planes 34, 34', which are sized to accommodate first and second conductive plates 32, 32' to allow the respective plates to be in electrical communication with each other when the clamp is engaged.

Figure 3B:
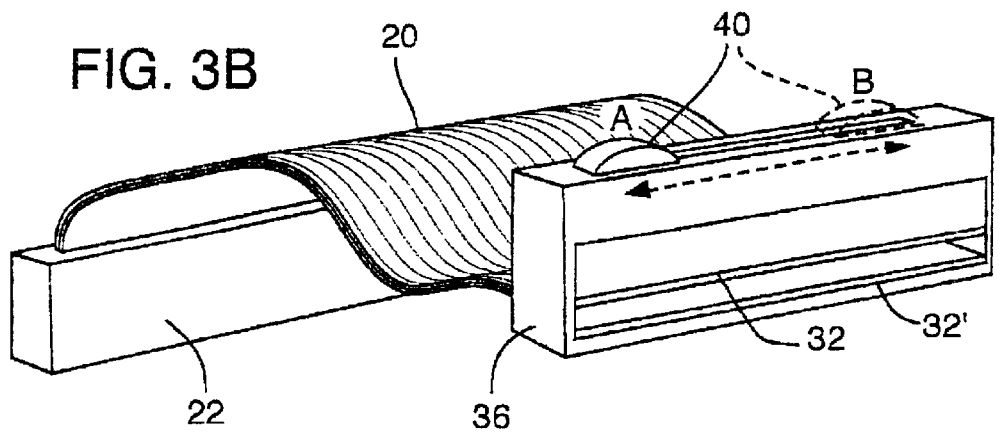
FIG. 3B is a perspective view of the power clamp utilizing a slide actuated clamping mechanism in accordance with an embodiment of the invention.
Figure 4:
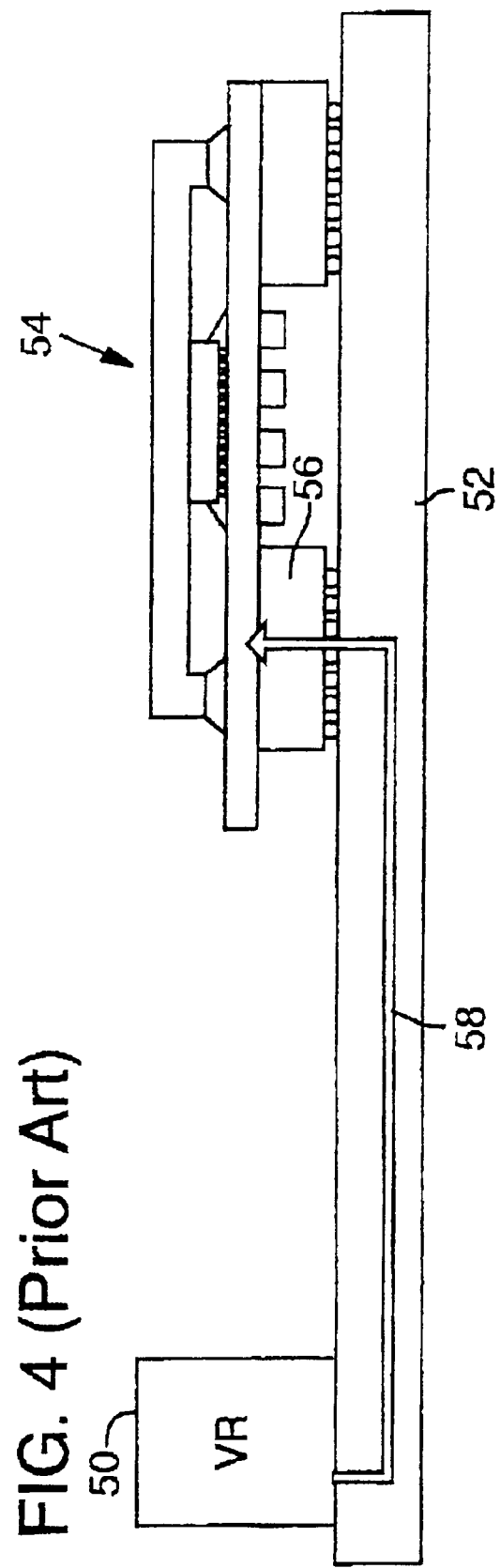
FIG. 4 is a side view of the prior art current delivery system for microelectronic packages known in the art.

In another embodiment in accordance with the invention, shown in FIG. 3B, a sliding clamp mechanism is provided. When slide 40 is moved from an unengaged position C to an engaged position D, slide 40 urges first and second conductive plates 32, 32' to forcibly engage first and second conductive planes 34, 34'. One skilled in the art would appreciate that any clamping mechanism that increases the contact force between first and second conductive plates 32, 32' and first and second conductive planes 34, 34' to reduce contact resistance there between would be effective without departing from the scope of the invention, including, but not limited to side clamps, finger screws or the like.

Although specific embodiments have been illustrated and described herein, it will be appreciated by those of ordinary skill in the art that a variety of alternate and/or equivalent implementations calculated to achieve the same purpose may be substituted for the specific embodiments shown and described without departing from the scope of the present invention. Those with skill in the art will readily appreciate that the present invention may be implemented in a very wide variety of embodiments. This application is intended to cover any adaptations or variations of the embodiments discussed herein. Therefore, it is manifestly intended that this invention be limited only by the claims and the equivalents thereof.

What is claimed is:

1. An apparatus comprising:
   a voltage regulation device;
   a microelectronic package having at least one edge adapted for electrical communication;
   a substrate having a first conductive path, the first conductive path electrically interconnecting the voltage regulation device to the microelectronic package, the first conductive path adapted to provide a majority of a current to the microelectronic package that is required in response to a transient current demand; and
   a second conductive path electrically interconnecting the voltage regulation device with the edge of the microelectronic package, the second conductive path having at least a portion external to the substrate and adapted to provide a majority of current to the microelectronic package that is required in response to a steady state current demand.

2. The apparatus of claim 1, wherein the second conductive path further comprises at least one inline capacitor, the capacitor adapted to lower the loop inductance of the second conductive path.

3. The apparatus of claim 1, wherein the second conductive path further comprises:
   a connector electrically coupled to the substrate;
   a third conductive path electrically interconnecting the voltage regulation device to the connector; and
   an external conductive path having a first end and a second end, the first end adapted to electrically interconnect with the connector, and the second end adapted to electrically interconnect with the edge of the microelectronic package.

4. The apparatus of claim 3, wherein the first end is adapted to removably interconnect with the connector and the second end is adapted to removably interconnect with the edge of the microelectronic package.

5. The apparatus of claim 1, further comprising:

a carrier substrate portion of the microelectronic package having an edge portion, the edge portion having at least two exposed electrically conductive planes; and a power clamp electrically coupled to a first to end of the second conductive path, the power clamp comprising an electrically conductive first plate and an electrically conductive second plate, the first and second plates adapted for engagement with the at least two exposed conductive planes respectively.

6. The apparatus of claim 5, wherein the power clamp further comprises a lever, the lever having a first position wherein the first power plate and the second power plate are in spaced apart parallel relationship and a second position wherein the first power plate and the second power plate are in removable electrical communication with the at least two exposed electrically conductive planes disposed there between.

7. An apparatus, comprising:

a voltage regulation device;

a microelectronic package having an edge adapted for electrical communication;

a substrate having a first conductive path, the first conductive path electrically interconnecting the voltage regulation device to the microelectronic package, the first conductive oath adapted to provide a majority of a current to the microelectronic package that is required in response to a transient current demand; and a means for electrically interconnecting the power voltage regulation device to the edge of the microelectronic package, the means for interconnecting being at least partially external to the substrate and adapted to provide a majority of the current to the microelectronic package that is required in response to a steady state current demand.

8. The apparatus of claim 7, wherein the means for interconnecting further comprises at least one inline capacitor, the capacitor adapted to lower the loop inductance of the second conductive path.

9. The apparatus of claim 7, wherein the at least partially external portion of the means for electrically interconnecting the voltage regulation device to the edge of the microelectronic package is removably electrically coupled to the substrate and the microelectronic package.

10. A power clamp for connecting to a microelectronic package having an edge with exposed conductive planes adapted for electrical communication, comprising:

a housing;

a conductive path, the conductive path comprising at least one delivery path and at least one return path;

a first conductive surface being part of the housing, the first conductive surface being electrically coupled to the at least one delivery path of the conductive path;

a second conductive surface being a part of the housing, the second conductive surface being electrically coupled to the at least one return path, the second conductive surface positioned opposite to and in spaced apart relation to the first conductive surface, the first and second conductive surfaces being in a complementary relationship with the exposed conductive planes; and a user actuatable clamp associated with the housing having a first position and a second position, actuation of the clamp from the first position to the second position causes the first and second conductive surfaces to forcibly engage the exposed conductive planes of the microelectronic package.

11. The power clamp of claim 10, wherein the first conductive surface and the second conductive surface are at least partially made of copper.

12. A power clamp for connecting to a microelectronic package having an edge with exposed conductive planes adapted for electrical communication, comprising:

a microelectronic package having an edge with exposed conductive planes adapted for electrical communication;

a housing;

a conductive path, the conductive path comprising at least one delivery path and at least one return path;

a first conductive surface being part of the housing, the first conductive surface being electrically coupled to the at least one delivery path of the conductive path;

a second conductive surface being a part of the housing, the second conductive surface being electrically coupled to the at least one return path, the second conductive surface positioned opposite to and in spaced apart relation to the first conductive surface, the first and second conductive surfaces being in a complementary relationship with the exposed conductive planes; and a user actuatable clamping means for causing the first and second conductive surfaces to forcibly engage exposed conductive planes of the microelectronic package.

13. The power clamp of claim 12, wherein the first conductive surface and the second conductive surface are at least partially made of copper.

* * * * *